United States Patent [19]
Nakashiba

[11] Patent Number: 6,087,647
[45] Date of Patent: Jul. 11, 2000

[54] SOLID STATE IMAGING DEVICE AND DRIVING METHOD THEREFOR

[75] Inventor: Yasutaka Nakashiba, Tokyo, Japan

[73] Assignee: NEC Corporation, Tokyo, Japan

[21] Appl. No.: 08/928,602

[22] Filed: Sep. 12, 1997

[30] Foreign Application Priority Data

Oct. 1, 1996 [JP] Japan ..................................... 8-260657

[51] Int. Cl.⁷ .............................. H01J 40/14; H01L 27/14
[52] U.S. Cl. ........................ 250/208.1; 257/443; 257/444
[58] Field of Search ......................... 250/208.1; 257/291, 257/443, 444, 448, 462

[56] References Cited

U.S. PATENT DOCUMENTS

| | | | |
|---|---|---|---|
| 5,128,735 | 7/1992 | Ohmi et al. | 257/443 |
| 5,481,124 | 1/1996 | Kozuka et al. | 257/444 |
| 5,604,364 | 2/1997 | Ohmi et al. | 250/208.1 |

FOREIGN PATENT DOCUMENTS

| | | | |
|---|---|---|---|
| 58-195371 | 11/1983 | Japan . | |
| 2-72637 | 3/1990 | Japan | H01L 21/339 |
| 45-03432 | 6/1992 | Japan | H01L 27/148 |

*Primary Examiner*—Stephone Allen
*Attorney, Agent, or Firm*—Hayes, Soloway, Hennessey, Grossman & Hage, P. C.

[57] ABSTRACT

The invention provides a solid state imaging device having horizontal charge transfer elements at the opposite ends of vertical charge transfer elements by which the potential of a first element separation region is stabilized to suppress reduction of the maximum handling charge amount of the vertical charge transfer elements and deterioration of the transfer efficiency of charge caused by an influence of a pulse signal applied to the vertical charge transfer elements. A predetermined potential is applied over a signal charge transfer period to a desired charge transfer electrode which does not contribute to a charge transferring operation and has overlaps with a first element separation region and a second element separation region so that a hole storage layer of a conduction type same as those of the first element separation region and the second element separation region is formed below the charge transfer electrode to electrically the first element separation region and the second element separation region to each other thereby to allow a reference potential to be supplied from the outside to the first element separation region via the second element separation region. Consequently, the potential of the first element separation region can be stabilized.

9 Claims, 9 Drawing Sheets

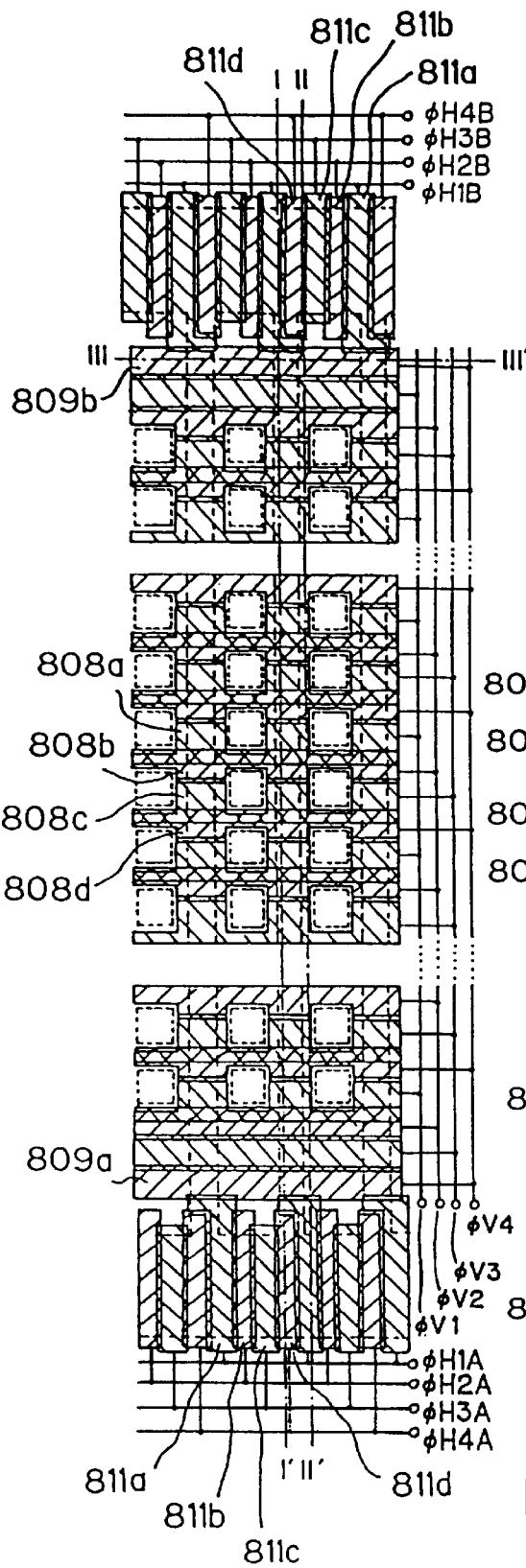
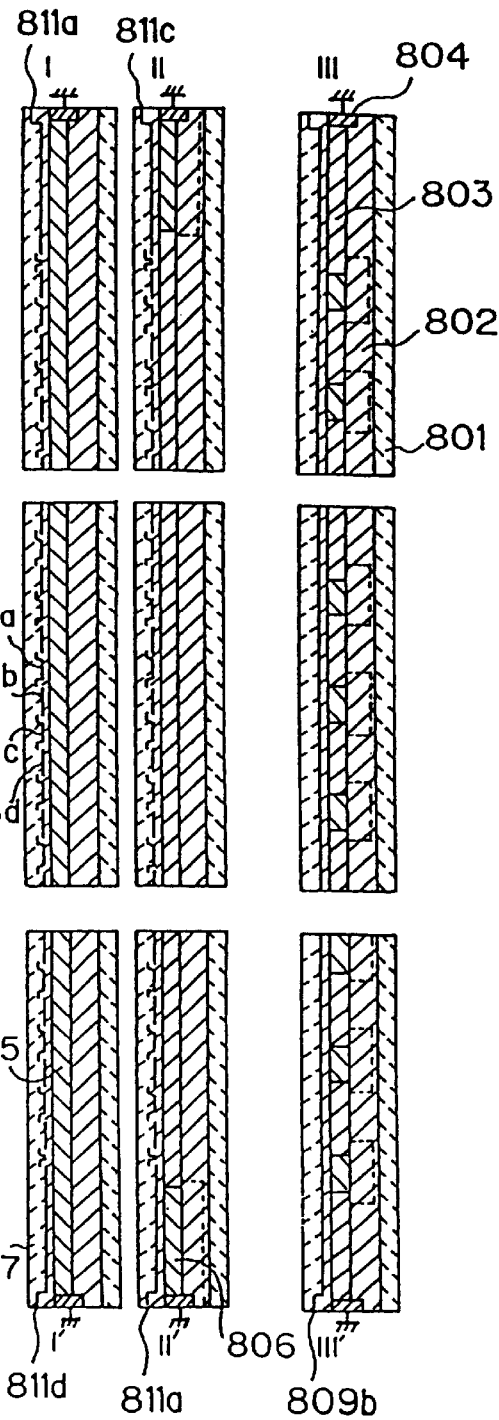
FIG. 2a PRIOR ART
FIG. 2b PRIOR ART
FIG. 2c PRIOR ART
FIG. 2d PRIOR ART

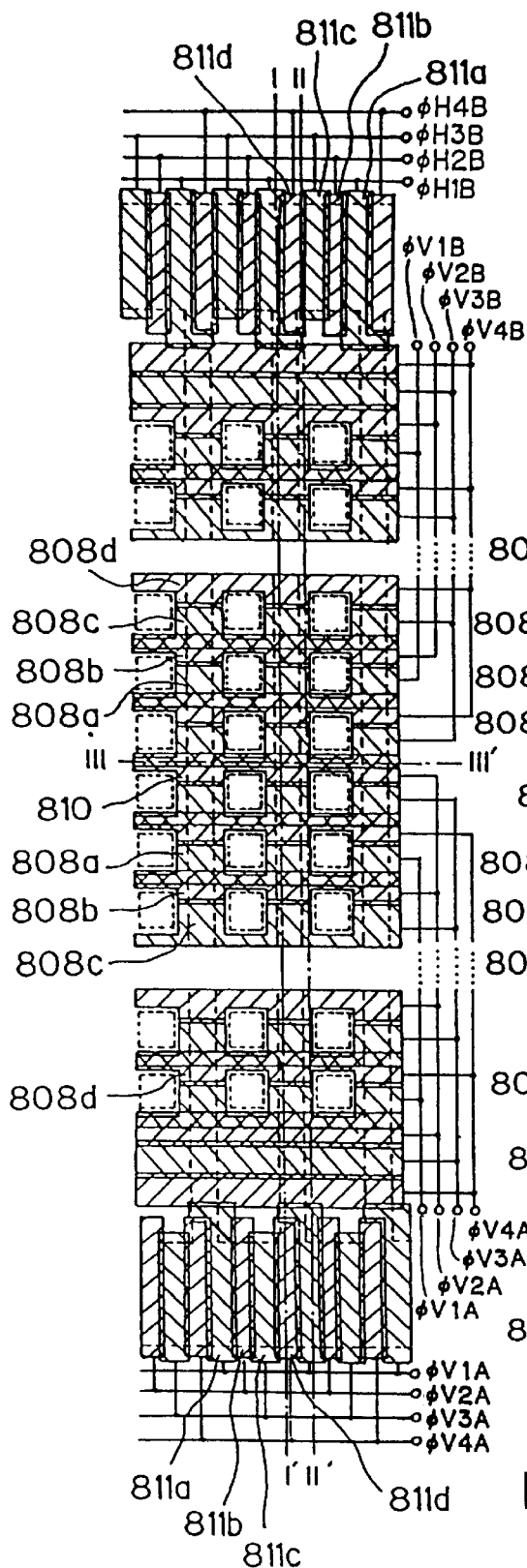
FIG. 4a
PRIOR ART
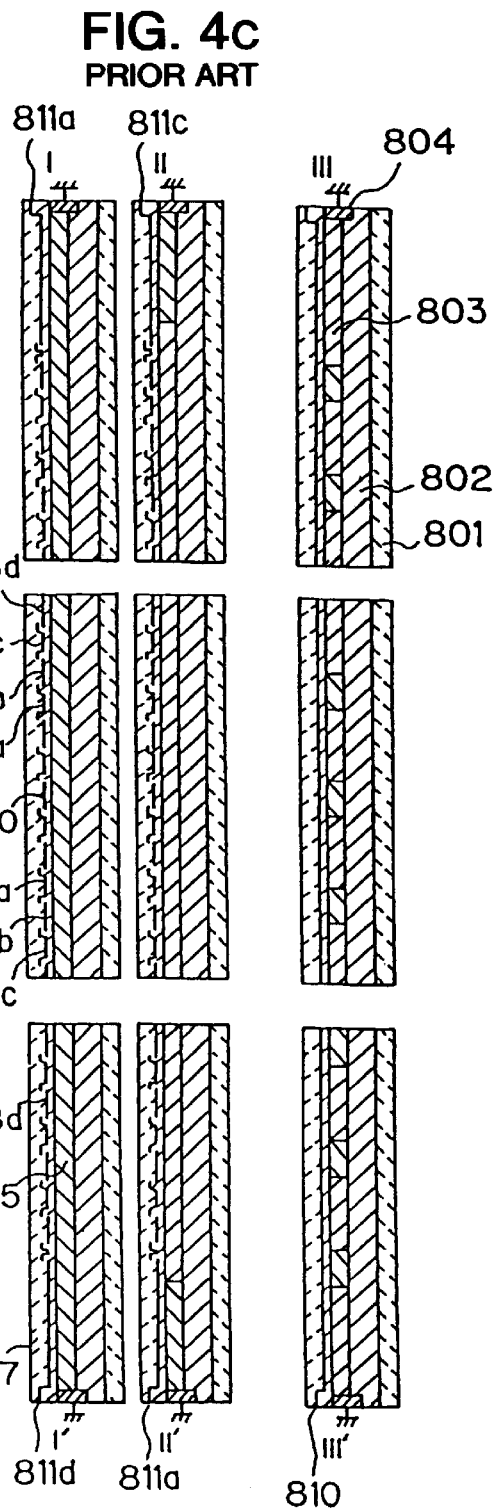
FIG. 4b
PRIOR ART
FIG. 4c
PRIOR ART
FIG. 4d
PRIOR ART

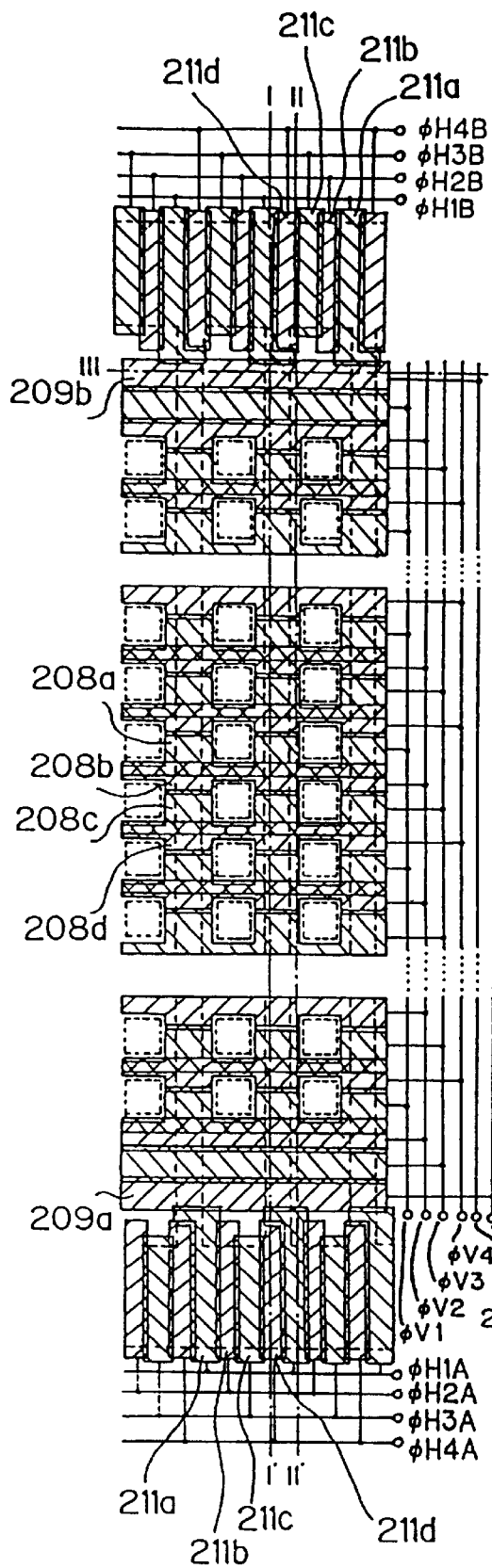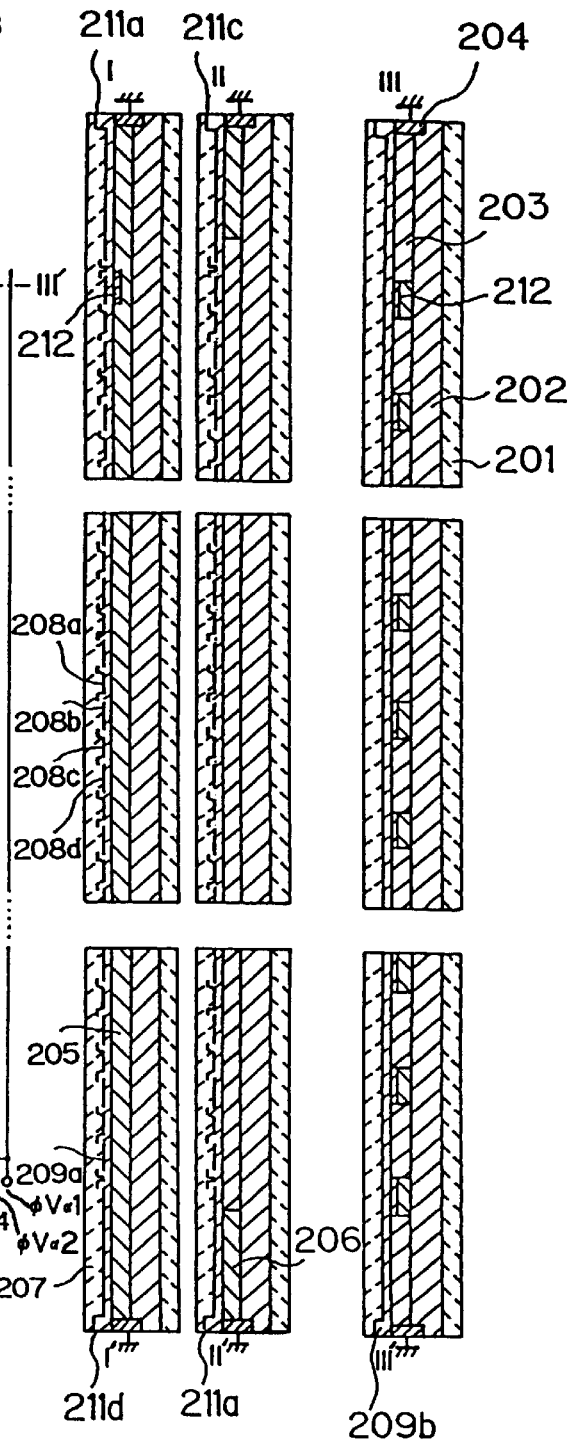
FIG. 7a
FIG. 7b
FIG. 7c
FIG. 7d

SOLID STATE IMAGING DEVICE AND DRIVING METHOD THEREFOR

BACKGROUND OF THE INVENTION

1. Field of the Invention

This invention relations to a solid state imaging device.

2. Description of the Related Art

The solid state imaging device shown in FIG. 1 is of the interline transfer type and has horizontal charge transfer elements at the opposite ends of vertical charge transfer elements.

The present conventional example includes, as shown in FIG. 1, first element separation region 701 and second element separation region 705. A plurality of columns of vertical charge transfer element 702 set composed of bidirectionally transferable charge transfer apparatus, photoelectric transform element 703 set individually disposed corresponding to vertical charge transfer elements 702, and bidirectionally transferable first horizontal charge transfer element 704a and second horizontal charge transfer element 704b electrically coupled to the opposite ends of vertical charge transfer elements 702 are provided in first element separation region 701. Meanwhile, first to fourth outputting circuit elements 706a, 706b and 706c, 706d coupled to the opposite ends of horizontal charge transfer elements 704a and element 704b, respectively, are provided in second element separation region 705. Second element separation region 705 is fixed to a reference potential via a metal wiring line at a peripheral portion of the device. It is to be noted that signals outputted from outputting circuit elements 706a, 706b, 706c and 706d are outputted to the outside via output terminals 707a, 707b, 707c and 707d, respectively (refer to Japanese Patent Laid-Open Application No. 1983-195371).

As shown in FIGS. 2a to 2d, in the present conventional example, P-type well layer 802 having an impurity concentration of approximately 5E15 $cm^{-3}$ is formed on one principal surface of N⁻-type semiconductor substrate 801 having an impurity concentration of approximately 5E14 $cm^{-3}$, and first P⁺-type semiconductor region 803 which forms first element separation region 701 and has an impurity concentration of approximately 1E18 $cm^{-3}$, second P⁺-type semiconductor region 804 which forms second element separation region 705 and has an impurity concentration of approximately 1E18 $cm^{-3}$, N-type semiconductor region 805 which forms vertical charge transfer elements 702 and has an impurity concentration of approximately 1E17 $cm^{-3}$, another N-type semiconductor region (not shown) which forms photoelectric transform elements 703 and has an impurity concentration of approximately 5E16 $cm^{-3}$, and N-type semiconductor region 806 which forms horizontal charge transfer elements 704a and 704b and has an impurity concentration of approximately 1E17 $cm^{-3}$ are formed on P-type well layer 802. Further, charge transfer electrodes 808a, 808b, 808c and 808d of vertical charge transfer elements 702 driven by charge transfer pulse signals $\phi V_1$, $\phi V_2$, $\phi V_3$ and $\phi V_4$ applied thereto and charge transfer electrodes 811a, 811b, 811c and 811d of first and second horizontal charge transfer elements 704a and 704b driven by charge transfer pulse signals $\phi H_1$, $\phi H_2$, $\phi H_3$ and $\phi H_4$ applied thereto, respectively, which are all formed from, for example, a polycrystalline silicon film of two layers, are disposed on the surface of N⁻-type semiconductor substrate 801 with insulation film 807 interposed therebetween.

Such a conventional solid state image device as described above is characterized in that, since a bidirectionally transferable charge transfer apparatus is employed for vertical charge transfer element 702 set and horizontal charge transfer elements 704a and 704b, the scanning direction of an imaging screen can be changed arbitrarily by changing over the combination of transfer pulse signals to be applied to the charge transfer electrodes by an external circuit.

When the transfer direction of vertical charge transfer element 702 set is selected to the downward direction in FIG. 1 and the transfer direction of horizontal charge transfer element 704a is simultaneously selected to the leftward direction in FIG. 1, signal charge stored in photoelectric transform element 703 set in response to an amount of incoming light is first read out to charge transfer electrodes 808a or 808c of corresponding vertical charge transfer element 702 set and then transferred successively in the downward direction in FIG. 1 in parallel in vertical charge transfer element 702 set, and then it is successively transferred to horizontal charge transfer element 704a. The signal charge sent to horizontal charge transfer element 704a is successively transferred in the leftward direction in FIG. 1 and outputted as a video signal from output terminal 707a via outputting circuit element 706a.

In this instance, screen scanning exhibits a mode in which horizontal scanning in the rightward direction in FIG. 1 beginning with the left lower corner of FIG. 1 is successively repeated for each one horizontal scanning period in the upward direction of FIG. 1 (the mode is hereinafter referred to as mode A).

If, from the condition described above, only the transfer direction of horizontal charge transfer element 704a is changed over to the rightward direction in FIG. 1, then screen scanning of the video signal outputted from output terminal 707b exhibits another mode wherein horizontal scanning to ward the left side in FIG. 1 beginning with the right lower corner of FIG. 1 is successively repeated for each one horizontal scanning period in the upward direction in FIG. 1 (the mode is hereinafter referred to as mode B).

Similarly, if the transfer direction of vertical charge transfer element 702 set is selected to the upward direction in FIG. 1 and the transfer direction of horizontal charge transfer element 704b is simultaneously selected to the leftward direction in FIG. 1, then screen scanning of the video signal outputted from output terminal 707c exhibits a further mode wherein horizontal scanning in the rightward direction in FIG. 1 beginning with the left lower corner of FIG. 1 is successively repeated for each one horizontal scanning period in the downward direction in FIG. 1 (the mode is hereinafter referred to as mode C).

Further, if, from the condition described above, only the transfer direction of second horizontal charge transfer element 704b is changed over to the rightward direction in FIG. 1, then screen scanning of the video signal outputted from output terminal 707d exhibits a still further mode wherein horizontal scanning toward the left side in FIG. 1 beginning with the right lower corner of FIG. 1 is successively repeated for each one horizontal scanning period in the downward direction in FIG. 1 (the mode is hereinafter referred to as mode D).

In a video camera which employs such a conventional solid state imaging device as described above, if the screen scanning mode of the video camera is set to the mode A and the positional relationship between the video camera and an object of imaging is adjusted so that a reproduced image by the image signal outputted from output terminal 707a then is an erected image in both of the upward, downward and leftward, rightward directions, then in the mode B, a reproduction image by the video signal outputted from output terminal 707b is an erected image in the upward and downward directions but is an inverted image in the leftward and rightward directions, but in the mode C, a reproduction signal by the video signal outputted from output terminal 707c is an erected image in the leftward and rightward directions but is an inverted image in the upward and downward directions. Further, in the mode D, a reproduction image by the video signal outputted from output terminal 707d is an inverted image in both of the upward and downward directions and the leftward and rightward directions.

While, in the conventional example described above, horizontal charge transfer elements 704a and 704b allow transfer in both directions, where horizontal charge transfer elements 704a and 704b otherwise allow transfer only in one direction, only the mode A and the mode C or the mode B and the mode C are available.

The solid state imaging device shown in FIGS. 3 and 4a to 4d is of the interline transfer type and has horizontal charge transfer elements at the opposite ends of vertical charge transfer elements.

Referring to FIG. 3, when the transfer direction in first vertical charge transfer element 702a set on the lower side of FIG. 3 with respect to a boundary between first and second vertical charge transfer elements 702a and 702b while the transfer direction in second vertical charge transfer element 702b set on the upper side of FIG. 3 and the transfer directions in first and second horizontal charge transfer elements 704a and 704b are simultaneously selected to the leftward direction in FIG. 3, signal charge stored in photo-electric transform element 703 set in response to the amount of incoming light is first read out to charge transfer electrodes 808a or 808b of corresponding first and second vertical charge transfer elements 702a and 702b. Then, in first vertical charge transfer element 702a set, the signal charge is successively transferred in the downward direction in FIG. 3 in parallel to horizontal charge transfer element 704a, and the signal charge sent to first horizontal charge transfer element 704a is successively transferred in the leftward direction in FIG. 3 and outputted as a video signal from output terminal 707a via the corresponding outputting circuit element, but in second vertical charge transfer element 702b set, the signal charge is successively transferred in the upward direction in FIG. 3 in parallel to second horizontal charge transfer element 704b, and the signal charge sent to horizontal charge transfer element 704b is successively transferred in the leftward direction in FIG. 3 and outputted as a video signal from output terminal 707c via the corresponding outputting circuit element.

In this instance, since video signals for one screen can be outputted in parallel from output terminals 707a and 707c, a mode wherein screen scanning can be performed at a high speed is exhibited (the mode is hereinafter referred to as mode E).

Such a solid state imaging device as described above is characterized in that, when compared with the solid state imaging device shown in FIGS. 1 and 2a to 2d, screen scanning can be performed at a higher speed since it includes first and second vertical charge transfer element 702a and 702b sets formed from a plurality of columns of bidirectionally transferable charge transfer apparatus and signal charge can be outputted in parallel from output terminal 707a and output terminal 707c.

In the solid state imaging device shown in FIG. 5, since first element separation region 701 and vertical charge transfer elements 702 contact with each other on the opposite side to a side on which horizontal charge transfer element 704 is provided, a reference potential is supplied to first element separation region 701 via second element separation region 705 which is fixed to the reference potential via a metal wiring line at a peripheral portion of the device.

However, in such a solid state imaging device wherein horizontal charge transfer elements are provided at the opposite ends of vertical charge transfer elements as described above, since it does not have a portion at which first element separation region 701 and second element separation region 705 contact with each other, first $P^+$-type semiconductor region 803 which forms first element separation region 701 and has an impurity concentration of approximately 1E18 $cm^{-3}$ and second $P^+$-type semiconductor region 804 which forms second element separation region 705 and has an impurity concentration of approximately 1E18 $cm^{-3}$ are electrically connected to each other via P-type well layer 802 which has an impurity concentration of approximately 5E15 $cm^{-3}$. However, since P-type well layer 802 has an electric resistance much higher than the electric resistance of first $P^+$-type semiconductor region 803 which forms first element separation region 701 or second $P^+$-type semiconductor region 804 which forms second element separation region 705 (for example, the electric resistance of P-type well layer 802 is approximately 50 to 100 k$\Omega$/□, and the electric resistances of first and second $P^+$-type semiconductor regions 803 and 804 are approximately 0.5 k$\Omega$/□), the potential of first element separation region 701 is unstable.

Further, the solid state imaging apparatus has another problem in that, since a pulse signal for charge transfer is applied to charge transfer electrodes 808 which form vertical charge transfer elements 702, the potential of first element separation region 701 is fluctuated by an influence of the charge transfer pulse signal, resulting in reduction of the maximum handling charge amount of vertical charge transfer elements 702, deterioration of the transfer efficiency and so forth.

SUMMARY OF THE INVENTION

It is an object of the present invention to provide a solid state imaging device having horizontal charge transfer elements at the opposite ends of vertical charge transfer elements and a driving method for the solid state imaging device by which the potential of a first element separation region is stabilized to suppress reduction of the maximum handling charge amount of the vertical charge transfer elements and deterioration of the transfer efficiency of charge caused by an influence of a pulse signal applied to the vertical charge transfer elements.

In order to attain the object described above, according to an aspect of the present invention, there is provided a first element separation region in which a plurality of columns of a vertical charge transfer element set formed from bidirectionally transferable charge transfer apparatus which have electrodes to which a predetermined potential is applied, a photoelectric transform element set disposed corresponding to said vertical charge transfer member set, a first horizontal charge transfer element which have electrodes to which a predetermined potential is applied electrically coupled to one end of said vertical charge transfer element set, and a second horizontal charge transfer element which have electrodes to which a predetermined potential is applied electrically coupled to the other end of said vertical charge transfer element set are formed, a second element separation region in which an outputting circuit element electrically coupled to each of the opposite ends or one end of each of said first and second horizontal charge transfer elements, and a charge storage layer of a conduction type same as those of said first element separation region and said second element separation region formed below electrodes in said vertical charge transfer element set or said horizontal charge transfer element set.

And there is provided a first element separation region in which a plurality of columns of a vertical charge transfer element set formed from bidirectionally transferable charge transfer apparatus, a photoelectric transform element set disposed corresponding to said vertical charge transfer member set, a first horizontal charge transfer element electrically coupled to one end of said vertical charge transfer element set, and a second horizontal charge transfer element electrically coupled to the other end of said vertical charge transfer element set are formed, a second element separation region in which an outputting circuit element electrically coupled to each of the opposite ends or one end of each of said first and second horizontal charge transfer elements, and charge transfer electrodes formed in said vertical charge transfer element set or said horizontal charge element set which form a charge storage layer of a conduction type same as those of said first element separation region and said second element separation region below said charge transfer electrodes by applying a predetermined potential to a desired one or ones of the charge transfer electrodes over a signal charge transfer period.

And there is provided a first element separation region in which a plurality of columns of first and second vertical charge transfer element sets formed adjacent each other from bidirectionally transferable charge transfer apparatus which have electrodes to which a predetermined potential is applied and electrically coupled to each other, a photoelectric transform element set disposed corresponding to said first and second vertical charge transfer member sets, a first horizontal charge transfer element which have electrodes to which a predetermined potential is applied electrically coupled to one end of said first vertical charge transfer element set, and a second horizontal charge transfer element which have electrodes to which a predetermined potential is applied electrically coupled to the other end of said first vertical charge transfer element set are formed, a second element separation region in which an outputting circuit element electrically coupled to each of the opposite ends or one end of each of said first and second horizontal charge transfer elements, and a charge storage layer of a conduction type same as those of said first element separation region and said second element separation region formed below electrodes in said vertical charge transfer element set or said horizontal charge transfer element set.

And there is provided a first element separation region in which a plurality of columns of first and second vertical charge transfer element sets formed adjacent each other from bidirectionally transferable charge transfer apparatus and electrically coupled to each other, a photoelectric transform element set disposed corresponding to said first and second vertical charge transfer member sets, a first horizontal charge transfer element electrically coupled to one end of said first vertical charge transfer element set; and a second horizontal charge transfer element electrically coupled to the other end of said first vertical charge transfer element set are formed, a second element separation region in which an outputting circuit element electrically coupled to each of the opposite ends or one end of each of said first and second horizontal charge transfer elements, and charge transfer electrodes formed in said vertical charge transfer element set or said horizontal charge transfer element set which form a charge storage layer of a conduction type same as those of said first element separation region and said second element separation region below said charge transfer electrodes by applying a predetermined potential to a desired one or ones of the charge transfer electrodes over a signal charge transfer period.

And there is provided the steps of:

applying the predetermined potential over the signal charge transfer period to those charge transfer electrodes in said vertical charge transfer elements which are disposed adjacent said second horizontal charge transfer element when said first horizontal charge transfer element is in a signal charge transfer mode, and applying the predetermined potential over the signal charge transfer period to those charge transfer electrodes in said vertical charge transfer elements which are disposed adjacent said first horizontal charge transfer element when said second horizontal charge transfer element is in a signal charge transfer mode, forming the charge storage layer of the conduction type same as those of said first element separation region and said second element separation region below the charge transfer electrodes.

And there is provided the steps of:

applying the predetermined potential for the signal charge transfer period to those charge transfer electrodes in said vertical charge transfer elements which are disposed adjacent said second horizontal charge transfer element when said first horizontal charge transfer element is in a signal charge transfer mode, and applying the predetermined potential over the signal charge transfer period to those charge transfer electrodes in said vertical charge transfer elements which are disposed adjacent said first horizontal charge transfer element when said second horizontal charge transfer element is in a signal charge transfer mode, forming the charge storage layer of the conduction type same as those of said first element separation region and said second element separation region below the charge transfer electrodes.

And there is provided the steps of:

applying the predetermined potential over the signal charge transfer period to said charge transfer electrodes in said second vertical charge transfer elements when said first horizontal charge transfer element is in a signal charge transfer mode, and applying the predetermined potential for the signal charge transfer period to said charge transfer electrodes in said first vertical charge transfer elements when said second horizontal charge transfer element is in a signal charge transfer mode, forming the charge storage layer of the conduction type same as those of said first element separation region and said second element separation region below said charge transfer electrodes.

And there is provided the steps of:

applying the predetermined potential over the signal charge transfer period to said charge transfer electrodes in said second vertical charge transfer elements when said first horizontal charge transfer element is in a signal charge transfer mode, and applying the predetermined potential for the signal charge transfer period to said charge transfer electrodes in said first vertical charge transfer elements when said second horizontal charge transfer element is in a signal charge transfer mode, forming the charge storage layer of the conduction type same as those of said first element separation region and said second element separation region below said charge transfer electrodes.

And there is provided the steps of:

applying a potential for the signal charge transfer period to a charge transfer electrode in said vertical charge transfer elements which is disposed on a boundary between said first vertical charge transfer elements and said second vertical charge transfer elements when said first and second horizontal charge transfer elements are in a signal charge transfer mode, forming the charge storage layer of the conduction type same as those of said first element separation region and said second element separation region below said charge transfer electrode.

In the present invention having the construction described above, since the predetermined potential is applied to a charge transfer electrode, which has overlaps with the first element separation region and the second element separation region and does not contribute to a charge transferring operation, over the signal charge transfer period, a charge storage layer of a conduction type same as those of the first element separation region and the second element separation region is formed below the charge transfer electrode. Consequently, the first element separation region and the second element separation region are electrically connected to each other and a reference potential is supplied from the outside to the first element separation region via the second element separation region. Consequently, the potential of the first element separation region is prevented from becoming unstable.

The above and other objects, features, and advantages of the present invention will become apparent from the following description referring to the accompanying drawings which illustrate an example of a preferred embodiment of the present invention.

BRIEF DESCRIPTION OF THE DRAWINGS

FIG. 2a is a plan view showing a detailed construction of the solid state imaging device shown in FIG. 1, FIG. 2b is a sectional view taken along line I-I' of FIG. 2a, FIG. 2c is a sectional view taken along line II-II' of FIG. 2a, and FIG. 2d is a sectional view taken along line III-III' of FIG. 2a;

FIG. 4a is a plan view showing a detailed construction of the solid state imaging device shown in FIG. 3, FIG. 4b is a sectional view taken along line I-I' of FIG. 4a, FIG. 4c is a sectional view taken along line II-II' of FIG. 4a, and FIG. 4d is a sectional view taken along line III-III' of FIG. 4a;

FIG. 7a is a plan view showing a detailed construction of the solid state imaging device shown in FIG. 6, FIG. 7b is a sectional view taken along line I-I' of FIG. 7a, FIG. 7c is a sectional view taken along line II-II' of FIG. 7a, and FIG. 7d is a sectional view taken along line III-III' of FIG. 7a;

FIG. 9a is a plan view showing a detailed construction of the solid state imaging device shown in FIG. 8, FIG. 9b is a sectional view taken along line I-I' of FIG. 9a, and FIG. 9c is a sectional view taken along line II-II' o f FIG. 9a;

FIG. 11a is a plan view showing a detailed construction of the solid state imaging device shown in FIG. 10, FIG. 11b is a sectional view taken along line I-I' of FIG. 11a, FIG. 11c is a sectional view taken along line II-II' of FIG. 11a, and FIG. 11d is a sectional view taken along line III-III' of FIG. 11a.

DETAILED DESCRIPTION OF THE PREFERRED EMBODIMENTS (First Embodiment)

The solid state imaging device in the present embodiment is of the interline transfer type and has horizontal charge transfer elements at the opposite ends of vertical charge transfer elements.

Figure 1:
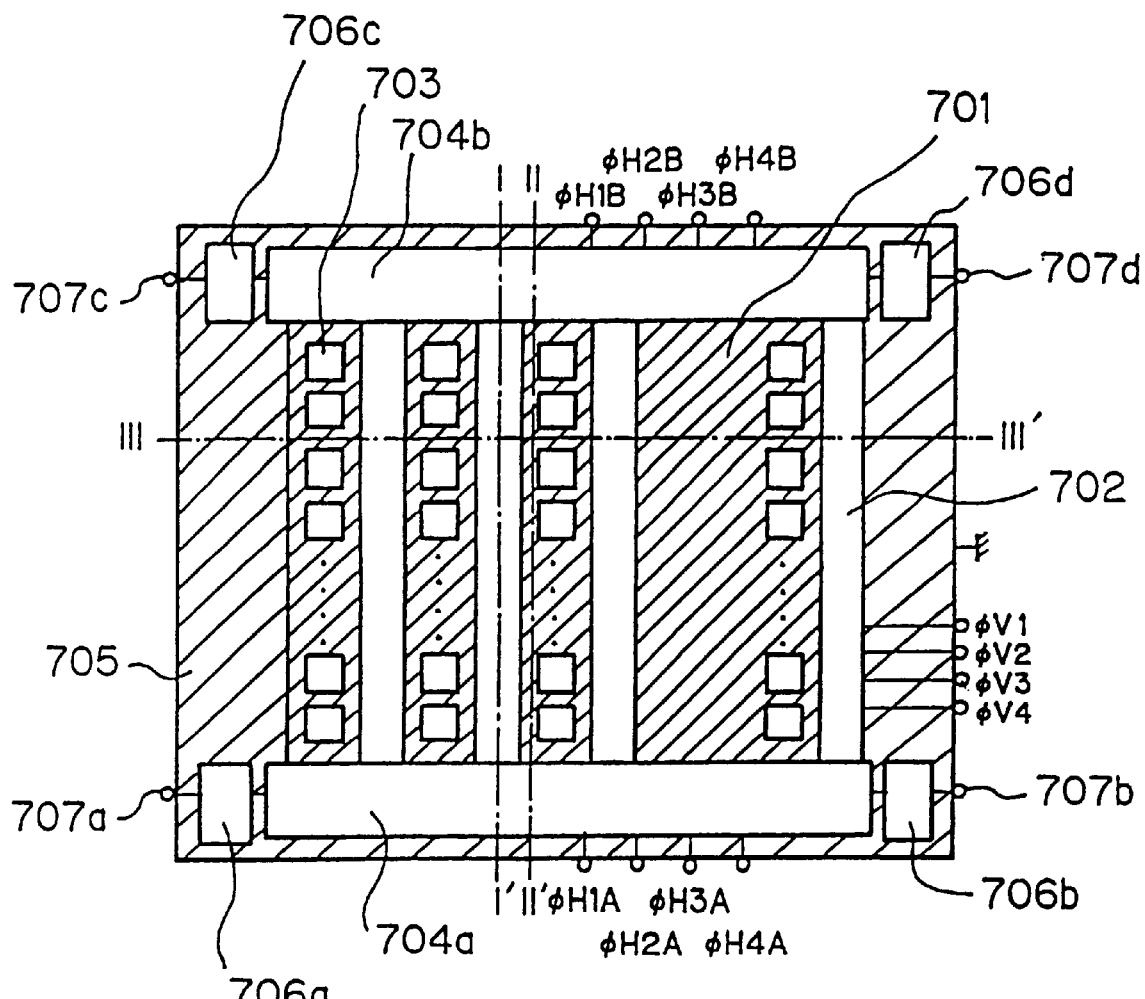
FIG. 1 is a schematic view showing an example of a construction of a conventional solid state imaging device.
Figure 3:
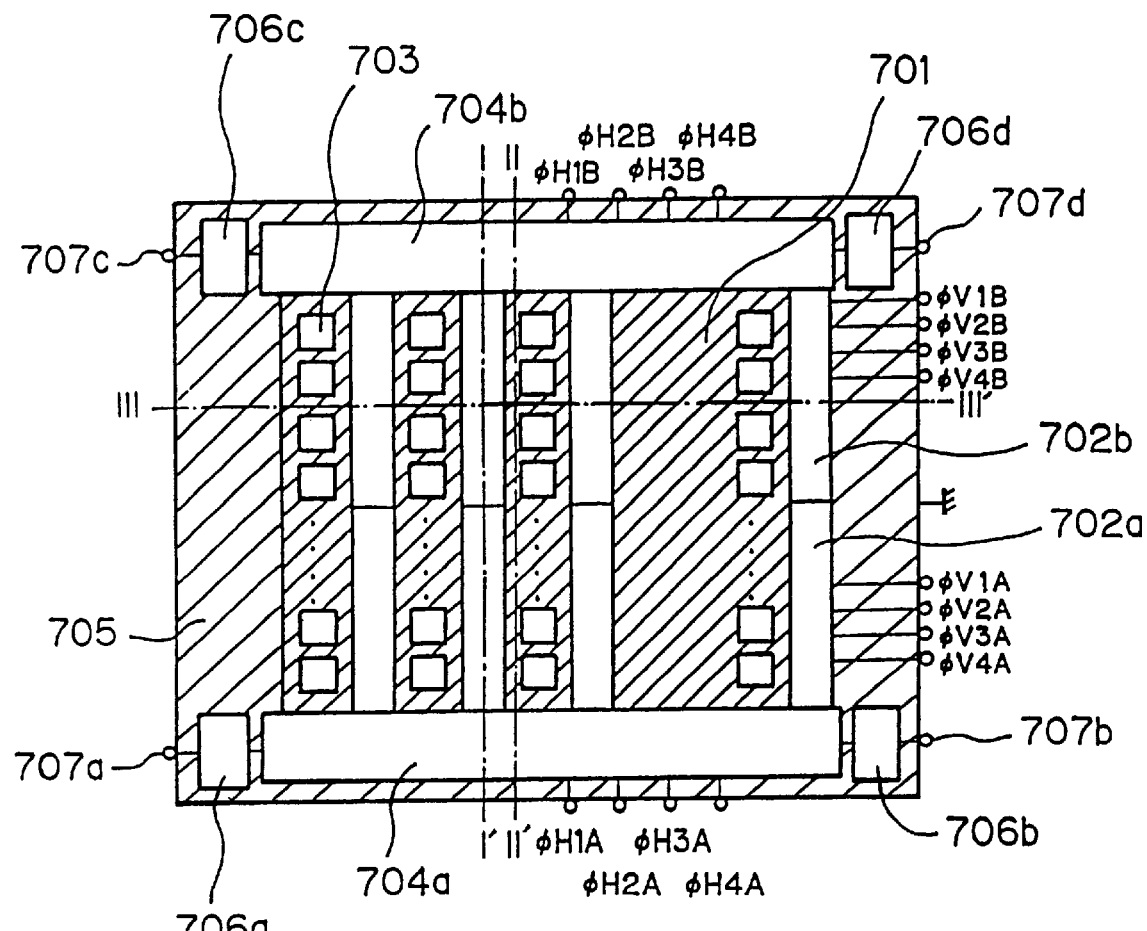
FIG. 3 is a schematic view showing another example of a construction of a conventional solid state imaging device.
Figure 5:
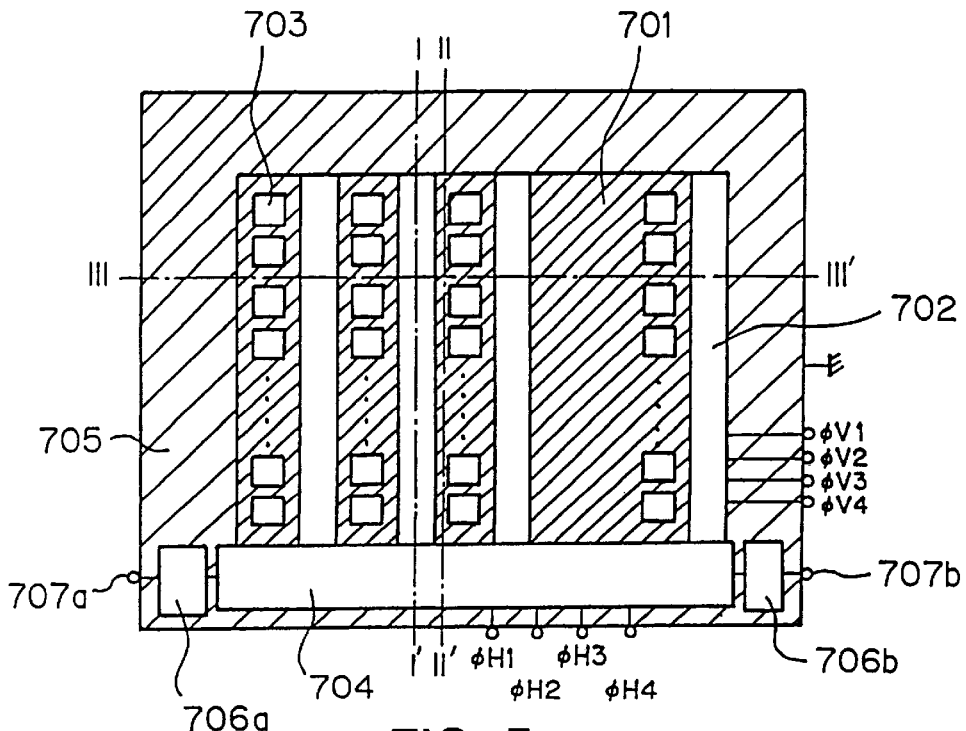
FIG. 5 is a view showing an example of a construction of a convent ional solid state imaging device wherein a horizontal charge transfer element is provided at only one ends of vertical charge transfer elements.
Figure 6:
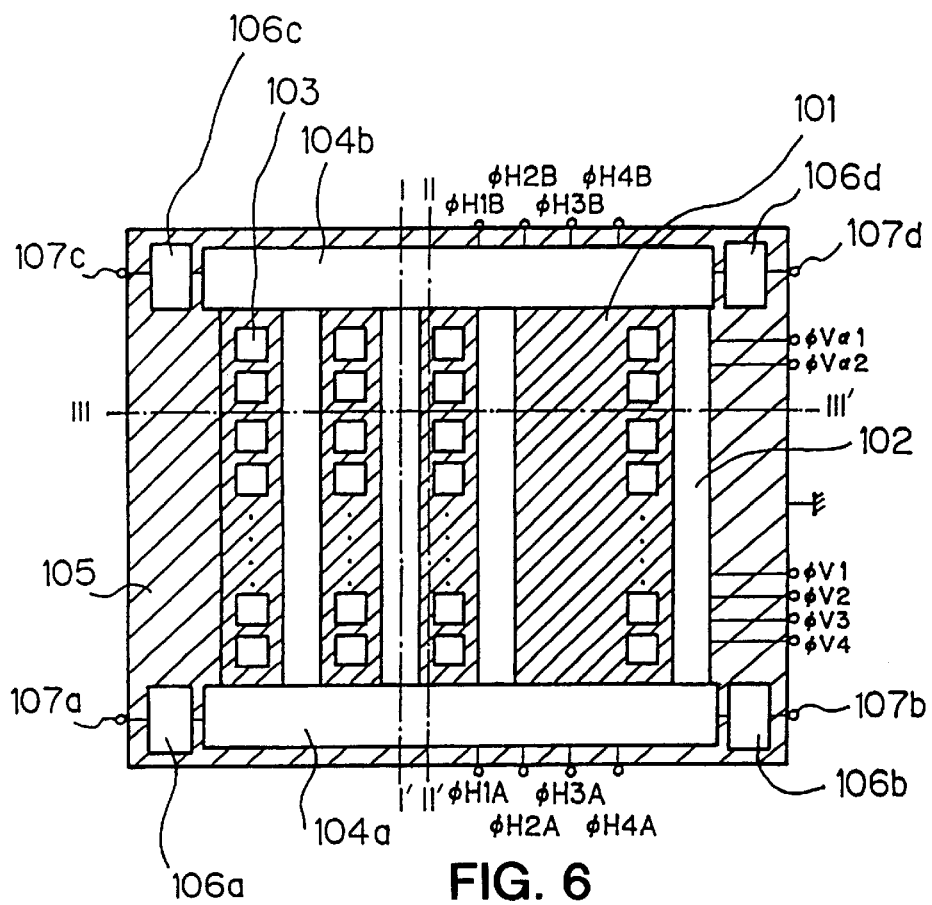
FIG. 6 is a schematic view showing a first embodiment of a solid state imaging device of the present invention.
Figure 8:
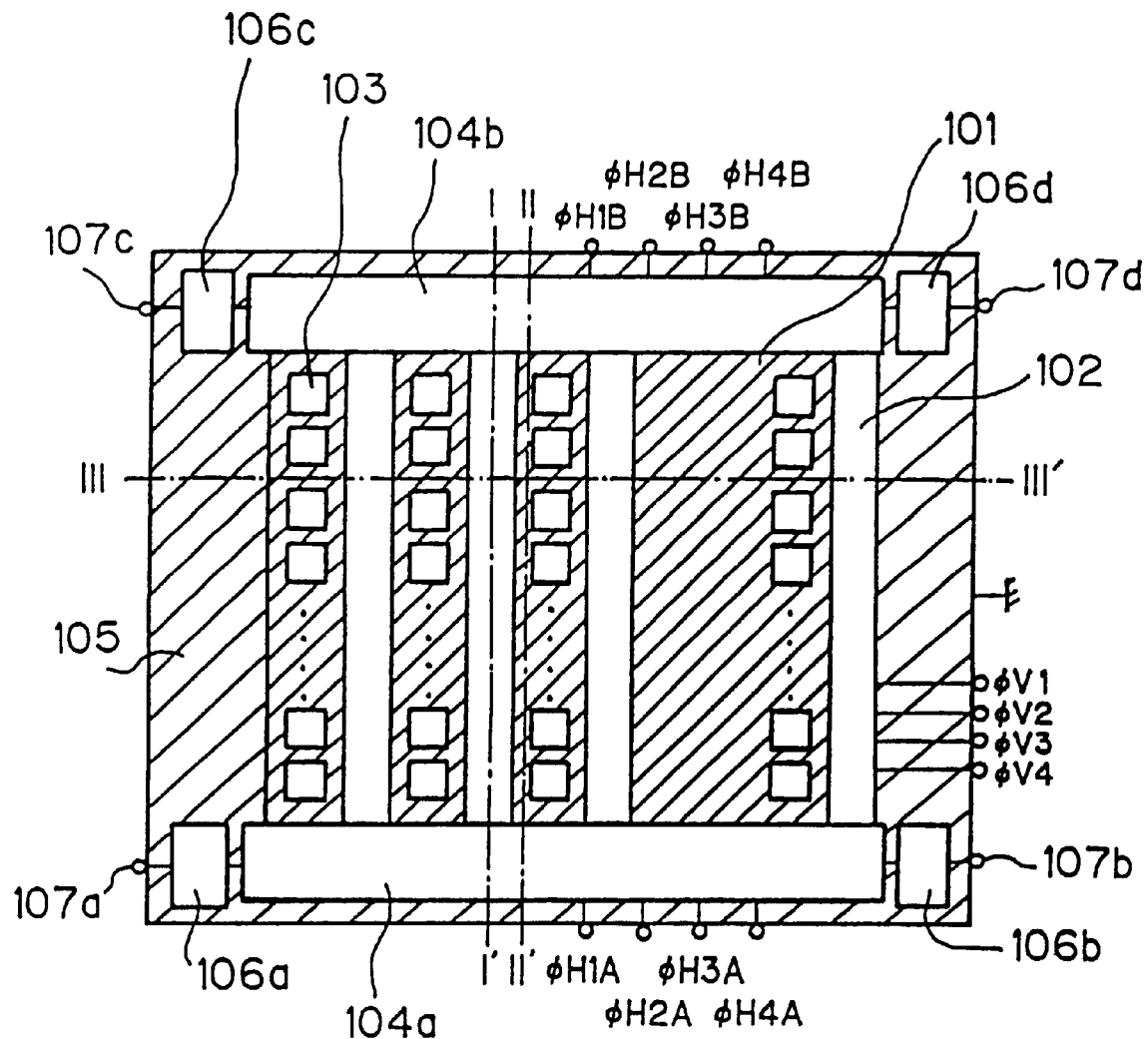
FIG. 8 is a schematic view showing a second embodiment of a solid state imaging device of the present invention.
Figures 9A, 9B, 9C:
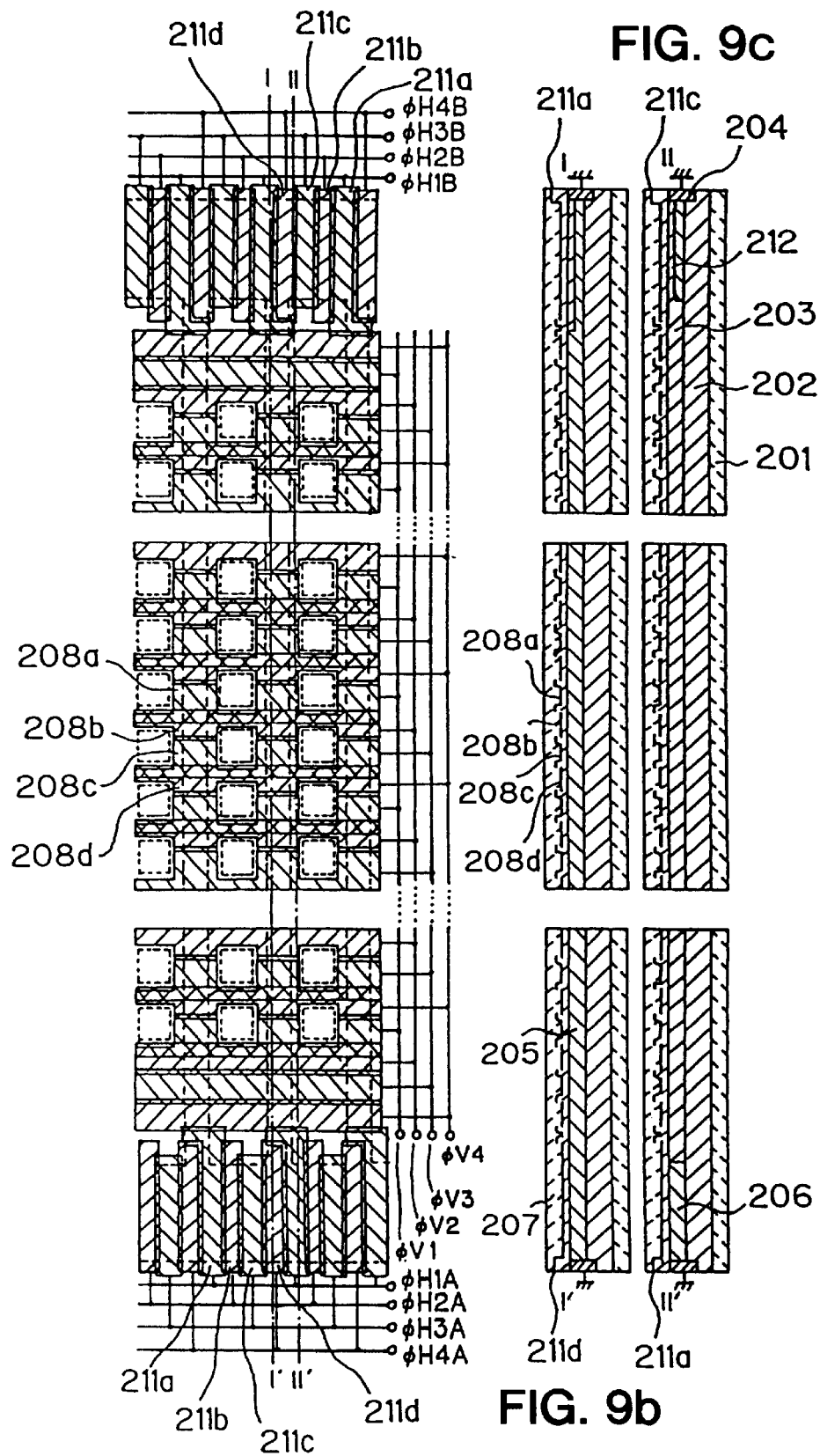
Figure 10:
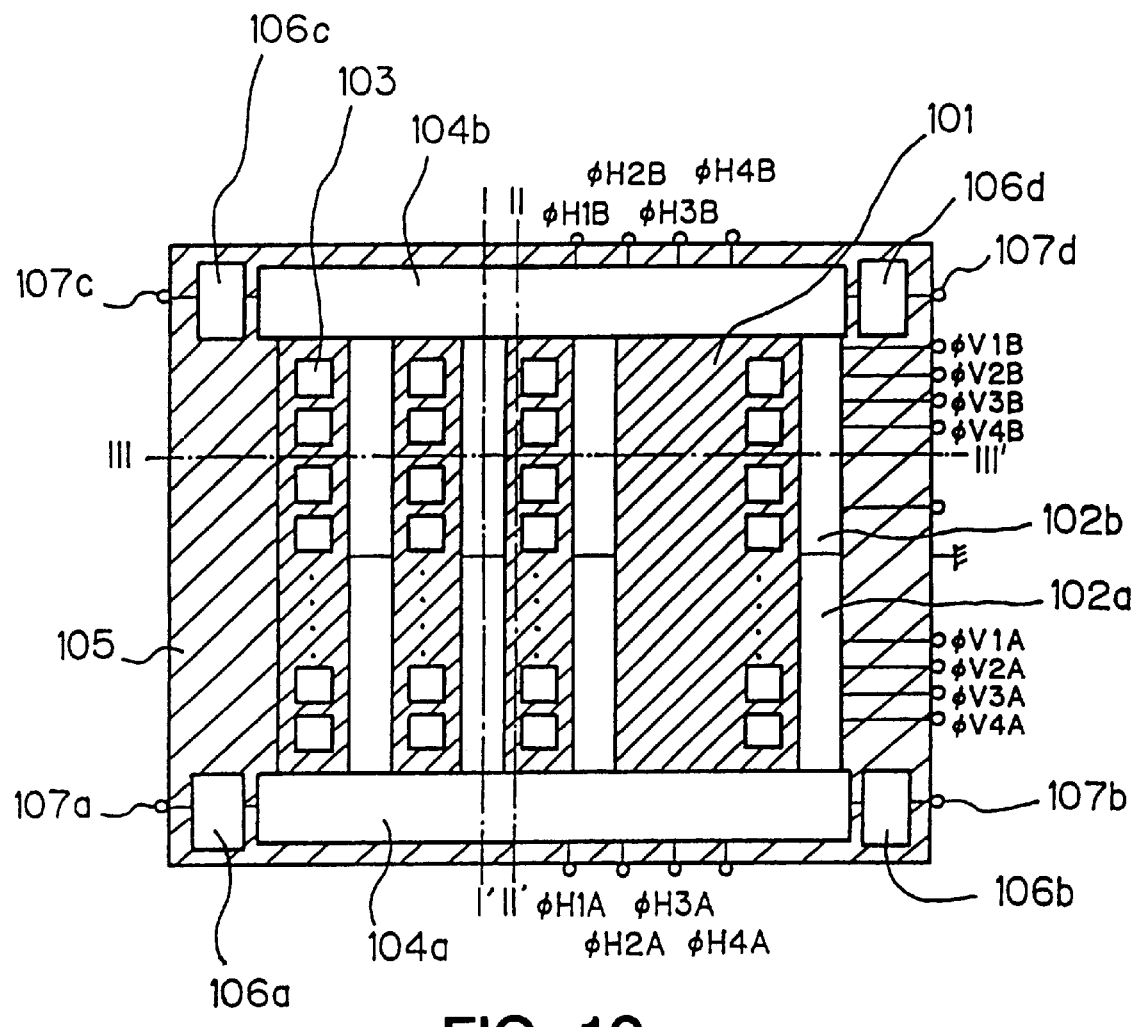
FIG. 10 is a schematic view showing a third embodiment of a solid state imaging device of the present invention.

The present embodiment includes first element separation region 101 and second element separation region 105 as shown in FIG. 6. A plurality of columns of vertical charge transfer element 102 set formed from bidirectionally transferable charge transfer apparatus, photoelectric transform element 103 set disposed corresponding to individual vertical charge transfer elements 102, and bidirectionally transferable first horizontal charge transfer element 104a and second horizontal charge transfer element 104b electrically coupled to the opposite ends of vertical charge transfer elements 102 are provided in first element separation region 101. Meanwhile, outputting circuit elements 106a, 106b and 106c, 106d coupled to the opposite ends of horizontal charge transfer elements 104a and 104b, respectively, are provided in second element separation region 105, and second element separation region 105 is set to a reference potential via a metal wiring line at a peripheral portion of the device. It is to be noted that signals outputted from outputting circuit elements 106a, 106b, 106c and 106d are outputted to the outside via output terminals 107a, 107b, 107c and 107d.

As shown in FIGS. 6 and 7a to 7d, in the present embodiment, P-type well layer 202 having an impurity concentration of approximately $5E15$ $cm^{-3}$ is formed on one principal surface of $N^-$-type semiconductor substrate 201 having an impurity concentration of approximately $5E14$ $cm^{-3}$. First $P^+$-type semiconductor region 203 which forms first element separation region 101 and has an impurity concentration of $1E18$ $cm^{-3}$, second $P^+$-type semiconductor region 204 which forms second element separation region 105 and has an impurity concentration of approximately $1E18$ $cm^{-3}$, N-type semiconductor region 205 which forms vertical charge transfer elements 102 and having an impurity concentration of $1E17$ $cm^{-3}$, another N-type semiconductor region (not shown) which forms photoelectric transform elements 103 and has an impurity concentration of $5E16$ $cm^{-3}$ and N-type semiconductor region 206 which forms first and second horizontal charge transfer elements 104a and 104b and has an impurity concentration of approximately 1E17 cm$^{-3}$ are formed on P-type well layer 202. Meanwhile, charge transfer electrodes 208a, 208b, 208c and 208d of vertical charge transfer elements 102 driven by charge transfer pulse signals $\phi V_1$, $\phi V_2$, $\phi V_3$ and $\phi V_4$ applied thereto, respectively, and charge transfer electrodes 211a, 211b, 211c and 211d of first and second horizontal charge transfer elements 104a and 104b driven by charge transfer pulse signals $\phi H_{A1}$, $\phi H_{A2}$, $\phi H_{A3}$, $\phi H_{A4}$, $\phi H_{B1}$, $\phi H_{B2}$, $\phi H_{B3}$ and $\phi H_{B4}$, respectively, which are formed from, for example, a polycrystalline silicon film, are formed on a surface of N$^-$-type semiconductor substrate 201 with insulation film 207 interposed therebetween.

It is to be noted that first and second final charge transfer electrodes 209a and 209b of vertical charge transfer elements 102 which have portions overlapping with first P$^+$-type semiconductor region 203 which forms first element separation region 101 and second P$^+$-type semiconductor region 204 which forms second element separation region 105 and are disposed adjacent first and second horizontal charge transfer elements 104a and 104b are wired so that charge transfer pulse signals $\phi V\alpha_1$ and $\phi V\alpha_2$ may individually be applied to them, respectively.

Here, in operation in the mode A or B described hereinabove, a pulse signal same as charge transfer pulse signal $\phi V_4$ is applied to second final charge transfer electrode 209a of vertical charge transfer elements 102 which contributes to a charge transferring operation while a negative potential (for example, approximately −10 V) is applied over a signal charge transfer period at least for one screen to second final charge transfer electrode 209b of vertical charge transfer elements 102 which does not contribute to a charge transferring operation, so that hole storage layer 212 can be formed on the surface of N-type semiconductor region 205 below second final charge transfer electrode 209b of vertical charge transfer elements 102 to electrically connect first P$^+$-type semiconductor region 203 of first element separation region 101 and second P$^+$-type semiconductor region 204 of second element separation region 105 to each other. On the other hand, in operation in the mode C or D described above, a pulse signal same as charge transfer pulse signal $\phi V_4$ is applied to second final charge transfer electrode 209b of vertical charge transfer elements 102 which contributes to a charge transferring operation while a negative potential (for example, approximately −10 V) is applied over a signal charge transfer period at least for one screen to second final charge transfer electrode 209a of vertical charge transfer elements 102b which does not contribute to a charge transferring operation, so that hole storage layer 212 can be formed on the surface of N-type semiconductor region 205 below final charge transfer electrode 209a of vertical charge transfer elements 102 to electrically connect first P$^+$-type semiconductor region 203 of first element separation region 101 and second P$^+$-type semiconductor region 204 of second element separation region 105 to each other. Consequently, the potential of first element separation region 101 can be stabilized.

It is to be noted that, while the first embodiment described above is described in a form wherein, for example, in operation in the mode A or B, a negative potential (for example, approximately −10 V) is applied over a signal charge transfer period at least for one screen to second final charge transfer electrode 209b of vertical charge transfer elements 102 which does not contribute to a charge transferring operation, a similar result can be obtained also when a negative potential (for example, approximately −10 V) is applied to the charge transfer electrodes of the other vertical charge transfer elements 102 over a signal period transfer period at least for one screen only if the charge transfer electrodes doe not contribute to a charge transferring operation and have portions which overlap with first P$^+$-type semiconductor region 203 which forms first element separation region 101 and second P$^+$-type semiconductor region 204 which forms second element separation region 105. Naturally, a similar result can be obtained also by operation in the mode C or D.

(Second Embodiment)

The solid state imaging device shown in FIGS. 8 and 9a to 9d is of the interline transfer type and has horizontal charge transfer elements at the opposite ends of vertical charge transfer elements.

As shown in FIGS. 8 and 9a to 9d, in the present embodiment, P-type well layer 202 having an impurity concentration of approximately 5E15 cm$^{-3}$ is formed on one principal surface of N$^-$-type semiconductor substrate 201 having an impurity concentration of approximately 5E14 cm$^{-3}$. First P$^+$-type semiconductor region 203 which forms first element separation region 101 and has an impurity concentration of 1E18 cm$^{-3}$, second P$^+$-type semiconductor region 204 which forms second element separation region 105 and has an impurity concentration of approximately 1E18 cm$^{-3}$, N-type semiconductor region 205 which forms vertical charge transfer elements 102 and having an impurity concentration of 1E17 cm$^{-3}$, another N-type semiconductor region (not shown) which forms photoelectric transform elements 103 and has an impurity concentration of 5E16 cm$^{-3}$ and N-type semiconductor region 206 which forms first and second horizontal charge transfer elements 104a and 104b and has an impurity concentration of approximately 1E17 cm$^{-3}$ are formed on P-type well layer 202. Meanwhile, charge transfer electrodes 208a, 208b, 208c and 208d of vertical charge transfer elements 102 driven by charge transfer pulse signals $\phi V_1$, $\phi V_2$, $\phi V_3$ and $\phi V_4$ applied thereto, respectively, and charge transfer electrodes 211a, 211b, 211c and 211d of first and second horizontal charge transfer elements 104a and 104b driven by charge transfer pulse signals $\phi H_{A1}$, $\phi H_{A2}$, $\phi H_{A3}$, $\phi H_{A4}$, $\phi H_{B1}$, $\phi H_{B2}$, $\phi H_{B3}$ and $\phi H_{B4}$, respectively, which are formed from, for example, a polycrystalline silicon film, are formed on a surface of N$^-$-type semiconductor substrate 201 with insulation film 207 interposed therebetween.

Here, in operation in the mode A or B described hereinabove, a negative potential (for example, approximately −10 V) is applied over a signal charge transfer period at least for one screen to charge transfer electrodes 211a, 211b, 211c and 211d of second horizontal charge transfer element 104b which does not contribute to a charge transferring operation and has portions overlapping with first P$^+$-type semiconductor region 203 which forms first element separation region 101 and second P$^+$-type semiconductor region 204 which forms second element separation region 105 so that hole storage layer 212 can be formed on the surface of N-type semiconductor region 205 below charge transfer electrodes 211a, 211b, 211c and 211d of second horizontal charge transfer element 104b to electrically connect first P$^+$-type semiconductor region 203 of first element separation region 101 and second P$^+$-type semiconductor region 204 of second element separation region 105 to each other. On the other hand, in operation in the mode C or D described above, a negative potential (for example, approximately −10 degrees) is applied over a signal charge transfer period at least for one screen to charge transfer electrodes 211a, 211b, 211c and 211d of first horizontal charge transfer element 104a which does not contribute to a charge transferring operation and has portions overlapping with first P$^+$-type semiconductor region 203 which forms first element separation region 101 and second P$^+$-type semiconductor region 204 which forms second element separation region 105 so that hole storage layer 212 can be formed on the surface of N-type semiconductor region 205 below charge transfer electrodes 211a, 211b, 211c and 211d of first horizontal charge transfer element 104a to electrically connect first P$^+$-type semiconductor region 203 of first element separation region 101 and second P$^+$-type semiconductor region 204 of second element separation region 105 to each other. Consequently, the potential of first element separation region 101 can be stabilized.

It is to be noted that, while the second embodiment described above is described in a form wherein, for example, in operation in the mode A or B, a negative potential (for example, approximately −10 V) is applied over a signal charge transfer period at least for one screen to all of charge transfer electrodes 211a, 211b, 211c and 211d of second horizontal charge transfer element 104b which does not contribute to a charge transferring operation, a similar result can be obtained also when a negative potential (for example, approximately −10 V) is applied to an arbitrary one of the charge transfer electrodes (for example, charge transfer electrode 211a connected to φH$_{B1}$) of second horizontal charge transfer element 104b or a combination of such charge transfer electrodes (for example, charge transfer electrodes 211a and 211b connected to φH$_{B1}$ and φH$_{B2}$, respectively) of second horizontal charge transfer element 104b over a signal period transfer period at least for one screen only if second horizontal charge transfer element 104b has portions which overlap with first P$^+$-type semiconductor region 203 which forms first element separation region 101 and second P$^+$-type semiconductor region 204 which forms second element separation region 105. Naturally, a similar result can be obtained also by operation in the mode C or D.

(Third Embodiment)

The solid state imaging device shown in FIGS. 10 and 11a to 11d is of the interline transfer type and has horizontal charge transfer elements at the opposite ends of vertical charge transfer elements.

As shown in FIGS. 10 and 11a to 11d, in the present embodiment, P-type well layer 202 having an impurity concentration of approximately 5E15 cm$^{-3}$ is formed on one principal surface of N$^-$-type semiconductor substrate 201 having an impurity concentration of approximately 5E14 cm$^{-3}$. First P$^+$-type semiconductor region 203 which forms first element separation region 101 and has an impurity concentration of 1E18 cm$^{-3}$, second P$^+$-type semiconductor region 204 which forms second element separation region 105 and has an impurity concentration of approximately 1E18 cm$^{-3}$, N-type semiconductor region 205 which forms first and second vertical charge transfer elements 102 and having an impurity concentration of 1E17 cm$^{-3}$, another N-type semiconductor region (not shown) which forms photoelectric transform elements 103 and has an impurity concentration of 5E16 cm$^{-3}$ and N-type semiconductor region 206 which forms first and second horizontal charge transfer elements 104a and 104b and has an impurity concentration of approximately 1E17 cm$^{-3}$ are formed on P-type well layer 202. Meanwhile, charge transfer electrodes 208a, 208b, 208c and 208d of first and second vertical charge transfer elements 102a and 102b driven by charge transfer pulse signals φV$_{A1}$, φV$_{A2}$, φV$_{A3}$, φV$_{A4}$, φV$_{B1}$, φV$_{B2}$, φV$_{B3}$ and φV$_{B4}$ applied thereto, respectively, and charge transfer electrodes 211a, 211b, 211c and 211d of first and second horizontal charge transfer element 104a and 104b driven by charge transfer pulse signals φH$_{A1}$, φH$_{A2}$, φH$_{A3}$, φH$_{A4}$, φH$_{B1}$, φH$_{B2}$, φH$_{B3}$ and φH$_{B4}$, respectively, which are formed from, for example, a polycrystalline silicon film, are formed on a surface of N$^-$-type semiconductor substrate 201 with insulation film 207 interposed therebetween.

It is to be noted that charge transfer electrode 210 of the vertical charge transfer elements disposed at the boundary between first and second vertical charge transfer elements 102a and 102b and having portions overlapping with first P$^+$-type semiconductor region 203 which forms first element separation region 101 and second P$^+$-type semiconductor region 204 which forms second element separation region 105 is wired so that a charge transfer pulse signal φVβ may be applied individually to it.

Here, in operation in the mode E described hereinabove, a negative potential (for example, approximately −10 V) is applied over a signal charge transfer period at least for one screen to charge transfer electrode 210 of the vertical charge transfer elements which is disposed on the boundary between first and second vertical charge transfer elements 102a and 102b and does not contribute to a charge transferring operation, so that hole storage layer 212 can be formed on the surface of N-type semiconductor region 205 below charge transfer electrode 210 of vertical charge transfer elements 102a and 102b to electrically connect first P$^+$-type semiconductor region 203 of first element separation region 101 and second P$^+$-type semiconductor region 204 of second element separation region 105 to each other. Consequently, the potential of first element separation region 101 can be stabilized.

It is to be noted that, while the embodiments described above are described each as a charge transfer apparatus having flush type channels formed on a P-type well provided on an N-type semiconductor substrate, it is a matter of course that the present invention can similarly be applied to a charge transfer apparatus which has embedded type channels formed on a P-type semiconductor substrate.

Further, while, in the embodiments described above, a solid state imaging device of the interline type is described, it is a matter of course that the present invention can similarly be applied to a solid state imaging device of the frame transfer type.

As described above, in the present invention, since a predetermined potential is applied over a signal charge transfer period to a desired charge transfer electrode which does not contribute to a charge transferring operation and has overlaps with a first element separation region and a second element separation region, a charge storage layer of a conduction type same as those of the first element separation region and the second element separation region is formed below the charge transfer electrode. Consequently, the first element separation region and the second element separation region are electrically connected to each other, and a reference potential is supplied from the outside to the first element separation region via the second element separation region. As a result, the potential of the first element separation region can be stabilized.

Consequently, since potential fluctuation caused by an influence of a pulse signal for charge transfer which is applied to charge transfer electrodes of vertical charge transfer elements can be suppressed, reduction of the maximum handling charge amount of the vertical charge transfer elements and deterioration of the transfer efficiency of the vertical charge transfer elements can be prevented.

It is to be understood that variations and modifications of SOLID STATE IMAGING DEVICE AND DRIVING METHOD THEREFORE disclosed herein will be evident to those skilled in the art. It is intended that all such modifications and variations be included within the scope of the appended claims.

What is claimed is:

1. A solid state imaging device comprising:
a first element separation region in which a plurality of columns of a vertical charge transfer element set formed from bidirectionally transferable charge transfer apparatus which have electrodes to which a predetermined potential is applied, a photoelectric transform element set disposed corresponding to said vertical charge transfer member set, a first horizontal charge transfer element which have electrodes to which a predetermined potential is applied electrically coupled to one end of said vertical charge transfer element set, and a second horizontal charge transfer element which have electrodes to which a predetermined potential is applied electrically coupled to the other end of said vertical charge transfer element set are formed,
a second element separation region in which an outputting circuit element electrically coupled to each of the opposite ends or one end of each of said first and second horizontal charge transfer elements, and
a charge storage layer of a conduction type same as those of said first element separation region and said second element separation region formed below electrodes in said vertical charge transfer element set or said horizontal charge transfer element set.

2. A solid state imaging device comprising:
a first element separation region in which a plurality of columns of first and second vertical charge transfer element sets formed adjacent each other from bidirectionally transferable charge transfer apparatus which have electrodes to which a predetermined potential is applied and electrically coupled to each other, a photoelectric transform element set disposed corresponding to said first and second vertical charge transfer member sets, a first horizontal charge transfer element which have electrodes to which a predetermined potential is applied electrically coupled to one end of said first vertical charge transfer element set, and a second horizontal charge transfer element which have electrodes to which a predetermined potential is applied electrically coupled to the other end of said first vertical charge transfer element set are formed,
a second element separation region in which an outputting circuit element electrically coupled to each of the opposite ends or one end of each of said first and second horizontal charge transfer elements, and
a charge storage layer of a conduction type same as those of said first element separation region and said second element separation region formed below electrodes in said vertical charge transfer element set or said horizontal charge transfer element set.

3. A solid state imaging device comprising:
a first element separation region in which a plurality of columns of a vertical charge transfer element set formed from bidirectionally transferable charge transfer apparatus, a photoelectric transform element set disposed corresponding to said vertical charge transfer member set, a first horizontal charge transfer element electrically coupled to one end of said vertical charge transfer element set, and a second horizontal charge transfer element electrically coupled to the other end of said vertical charge transfer element set are formed,
a second element separation region in which an outputting circuit element electrically coupled to each of the opposite ends or one end of each of said first and second horizontal charge transfer elements, and
charge transfer electrodes formed in said vertical charge transfer element set or said horizontal charge element set which form a charge storage layer of a conduction type same as those of said first element separation region and said second element separation region below said charge transfer electrodes by applying a predetermined potential to a desired one or ones of the charge transfer electrodes over a signal charge transfer period.

4. A driving method for driving a solid state imaging device as set forth in claim 3, comprising the steps of:
applying the predetermined potential over the signal charge transfer period to those charge transfer electrodes in said vertical charge transfer elements which are disposed adjacent said second horizontal charge transfer element when said first horizontal charge transfer element is in a signal charge transfer mode, and
applying the predetermined potential over the signal charge transfer period to those charge transfer electrodes in said vertical charge transfer elements which are disposed adjacent said first horizontal charge transfer element when said second horizontal charge transfer element is in a signal charge transfer mode,
forming the charge storage layer of the conduction type same as those of said first element separation region and said second element separation region below the charge transfer electrodes.

5. A driving method for driving a solid state imaging device as set forth in claim 3, comprising the steps of:
applying the predetermined potential over the signal charge transfer period to said charge transfer electrodes in said second vertical charge transfer elements when said first horizontal charge transfer element is in a signal charge transfer mode, and
applying the predetermined potential for the signal charge transfer period to said charge transfer electrodes in said first vertical charge transfer elements when said second horizontal charge transfer element is in a signal charge transfer mode,
forming the charge storage layer of the conduction type same as those of said first element separation region and said second element separation region below said charge transfer electrodes.

6. A solid state imaging device comprising:
a first element separation region in which a plurality of columns of first and second vertical charge transfer element sets formed adjacent each other from bidirectionally transferable charge transfer apparatus and electrically coupled to each other, a photoelectric transform element set disposed corresponding to said first and second vertical charge transfer member sets, a first horizontal charge transfer element electrically coupled to one end of said first vertical charge transfer element set, and a second horizontal charge transfer element electrically coupled to the other end of said first vertical charge transfer element set are formed,
a second element separation region in which an outputting circuit element electrically coupled to each of the opposite ends or one end of each of said first and second horizontal charge transfer elements, and charge transfer electrodes formed in said vertical charge transfer element set or said horizontal charge transfer element set which form a charge storage layer of a conduction type same as those of said first element separation region and said second element separation region below said charge transfer electrodes by applying a predetermined potential to a desired one or ones of the charge transfer electrodes over a signal charge transfer period.

7. A driving method for driving a solid state imaging device as set forth in claim 6, comprising the steps of:

applying the predetermined potential for the signal charge transfer period to those charge transfer electrodes in said vertical charge transfer elements which are disposed adjacent said second horizontal charge transfer element when said first horizontal charge transfer element is in a signal charge transfer mode, and applying the predetermined potential over the signal charge transfer period to those charge transfer electrodes in said vertical charge transfer elements which are disposed adjacent said first horizontal charge transfer element when said second horizontal charge transfer element is in a signal charge transfer mode, forming the charge storage layer of the conduction type same as those of said first element separation region and said second element separation region below the charge transfer electrodes.

8. A driving method for driving a solid state imaging device as set forth in claim 6, comprising the steps of:

applying the predetermined potential over the signal charge transfer period to said charge transfer electrodes in said second vertical charge transfer elements when said first horizontal charge transfer element is in a signal charge transfer mode, and applying the predetermined potential for the signal charge transfer period to said charge transfer electrodes in said first vertical charge transfer elements when said second horizontal charge transfer element is in a signal charge transfer mode, forming the charge storage layer of the conduction type same as those of said first element separation region and said second element separation region below said charge transfer electrodes.

9. A driving method for driving a solid state imaging device as set forth in claim 6, comprising the steps of:

applying a potential for the signal charge transfer period to a charge transfer electrode in said vertical charge transfer elements which is disposed on a boundary between said first vertical charge transfer elements and said second vertical charge transfer elements when said first and second horizontal charge transfer elements are in a signal charge transfer mode, forming the charge storage layer of the conduction type same as those of said first element separation region and said second element separation region below said charge transfer electrode.

* * * * *